United States Patent
Shih et al.

(10) Patent No.: US 6,245,654 B1
(45) Date of Patent: Jun. 12, 2001

(54) METHOD FOR PREVENTING TUNGSTEN CONTACT/VIA PLUG LOSS AFTER A BACKSIDE PRESSURE FAULT

(75) Inventors: Po-Jen Shih, Taipei; Po-Jen Chen, Tainan, both of (TW)

(73) Assignee: Taiwan Semiconductor Manufacturing Company, Ltd, Hsinchu (TW)

( * ) Notice: Subject to any disclaimer, the term of this patent is extended or adjusted under 35 U.S.C. 154(b) by 0 days.

(21) Appl. No.: 09/283,063

(22) Filed: Mar. 31, 1999

(51) Int. Cl.[7] .................................................. H01L 21/44
(52) U.S. Cl. ..................... 438/597; 438/582; 438/656; 438/677; 438/685
(58) Field of Search ..................... 438/582, 583, 438/656, 677, 685, 597

(56) References Cited

U.S. PATENT DOCUMENTS

| | | | |
|---|---|---|---|
| 5,028,565 | * 7/1991 | Chang et al. | 437/192 |
| 5,332,691 | * 7/1994 | Kinoshita et al. | 437/192 |
| 5,795,824 | * 8/1998 | Hancock | 438/656 |
| 5,804,249 | * 9/1998 | Sukharev et al. | 427/99 |
| 6,066,366 | * 5/2000 | Berenbaum et al. | 427/250 |

* cited by examiner

Primary Examiner—Matthew Smith
Assistant Examiner—Renzo N. Rocchegiani
(74) Attorney, Agent, or Firm—Tung & Associates

(57) ABSTRACT

A method for preventing tungsten contact/via plug loss after a backside pressure fault defect in a deposition chamber is provided. In the method, first deposited by a silane soak step and a tungsten nucleation layer is subsequently deposited, a plasma treating step by a $H_2$ plasma is carried out at a temperature of not higher than 480° C. for a time period of at least 15 seconds. The plasma treating step significantly improves the uniform distribution of the silicon prenucleation layer and substantially prevents the formation of any tungsten silicide layers such that during an etchback process, the dry etchant utilized does not remove a tungsten silicide layer at a much faster rate and leads to a plug loss defect.

17 Claims, 2 Drawing Sheets

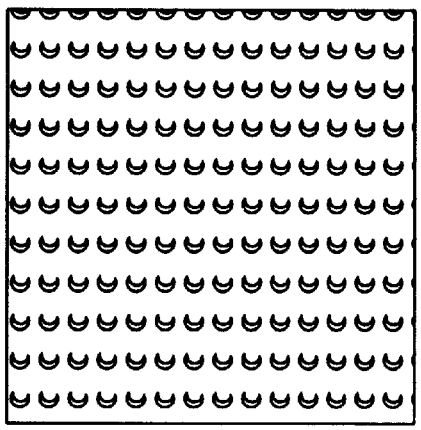
(PriorArt)
FIG. 1A
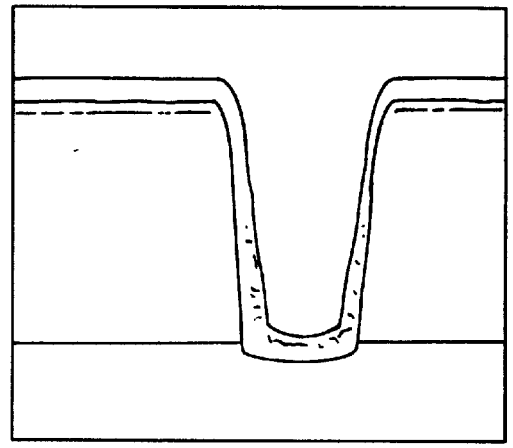
(PriorArt)
FIG. 1B

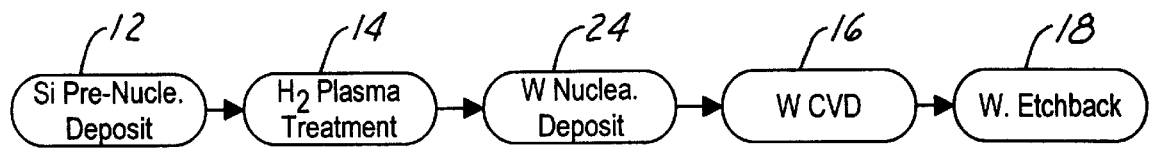

FIG. 2

| SAMPLE | BSPF | Vacuun Break | Before Deposition Plasma Treatment | W-Loss |
|---|---|---|---|---|
| 1 | No, But Stop On Step 7 | Y | N | N |
| 2 | Y | N | N | Y |
| 3 | Y | Y | Pressure Servo 0.8torr N2(300scc) Plasma 10sec | Edge Loss |
| 4 | Y | Y | Pressure Servo 0.8.0torr N2(300scc) Plasma 20sec | Edge Loss |
| 5 | Y | Y | Pressure Servo 2.0torr N2(300scc) Plasma 20sec | Edge Loss |
| 6 | Y | Y | Pressure Servo 2.0torr N2(600scc) Plasma 20sec | Edge Loss |
| 7 | Y | Y | Pressure Servo 2.0torr H2(300scc) Plasma 10sec | Edge Loss |
| 8 | Y | Y | Pressure Servo 2.0torr H2(300scc) Plasma 20sec | N |
| 9 | Y | Y | Pressure Servo 2.0torr H2(300scc) Plasma 30sec | N |

FIG. 3

METHOD FOR PREVENTING TUNGSTEN CONTACT/VIA PLUG LOSS AFTER A BACKSIDE PRESSURE FAULT

FIELD OF THE INVENTION

The present invention generally relates to a method for preventing tungsten contact/via plug loss in a tungsten CVD deposition/etchback process and more particularly, relates to a method for preventing tungsten contact/via plug loss in a tungsten CVD deposition/etchback process after a backside pressure fault occurrence in a chemical vapor deposition chamber by treating the wafer with $H_2$ plasma prior to the tungsten CVD deposition process.

BACKGROUND OF THE INVENTION

In the fabrication of semiconductor devices, metal contacts and vias are frequently formed in contact holes and via openings on silicon wafers that have been pre-processed with insulating layers on top. Devices are then fabricated by connecting the components with metal contacts and vias to form the integrated circuit. In particular, aluminum, aluminum alloys, tungsten and tungsten alloys are frequently used for depositing into contact holes and via openings on silicon substrates. The deposition process can be carried out either in a physical vapor deposition chamber or in a chemical vapor deposition chamber.

As the dimensions of semiconductor devices continuously to shrink in the miniaturization of modern semiconductor devices to the sub-half-micron range, via openings and contact holes must also shrink. Consequently, the openings and holes to be filled have larger aspect ratios, i.e., the ratios between the depth of the opening or hole and the diameter.

Difficulties have been encountered in depositing conductive metals into via openings and contact holes that have high aspect ratios by the conventional sputtering process. As the openings or holes become smaller and deeper, the bottom and sides of an opening or hole receive fewer deposited metal particles than the top surface of the device. The end result of such a phenomenon, sometimes called a shadowing effect, is that metal layers formed by the particles hang over the opening forming an overhang. The overhang closes before the opening is completely filled as the deposition process progresses and thus creating a void in the opening or hole.

One technique used to remedy the shadowing effect of the sputtering process is to use a tungsten chemical vapor deposition (W CVD) technique for filling openings and holes that have large aspect ratios. The W CVD process solves the difficult problems in metalization to ensure enough metal continuity in contact windows and vias. The step coverage of deep openings or holes by the W CVD particles is greatly improved over that possible by any other deposition techniques. In a W CVD process conducted on a silicon substrate for filling a contact hole, the basic chemistry is represented by:

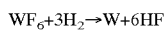

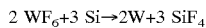

There may also be reactions between $WF_6$ and $SiH_4$ and furthermore, $WF_6$ may be reduced by Al and Ti through different chemical processes.

During a W CVD deposition process, a wafer is usually held on a vacuum chuck that is heated to a temperature between about 400° C. and about 500° C. A shower head is positioned opposite to the wafer where $WF_6$, $H_2$ or $SiH_4$ gases are injected. Normally, a two-or three-step process is involved where $SiH_4$ is first introduced without any flow of $WF_6$ to initiate a deposition of a very thin seed layer of amorphous silicon as a prenucleation layer. The prenucleation process is then followed by a $SiH_4+WF_6$ silane reduction nucleation process for depositing a thin W nucleation layer, and then the faster-rate $H_2+WF_6$ hydrogen reduction process for bulk W deposition. During the nucleation stage, less than 100 nm of tungsten is deposited, while the bulk of the tungsten deposition is by the hydrogen reduction process. The multi-stage deposition process is designed such that during the initial nucleation stage, the silicon from the source/drain area is not consumed in the reaction since $WF_6$ would react readily with Si. When $WF_6$ reacts with Si from the source/drain region, a defect known as junction leakage may occur. The introduction of $SiH_4$ first into the reaction avoids the consumption of Si from the substrate. The initial introduction of $SiH_4$ into the reaction without $WF_6$ for the deposition of the prenucleation layer of Si is known as a silane soak step.

In the W CVD process, a W CVD is frequently blanket-deposited onto a wafer surface and into the contact holes after a metal nucleation layer is first deposited on the entire wafer. The W deposited on the insulating layer, i.e., on a $SiO_2$ layer, is then etched away in an etchback process by a process of reactive ion etching. After the etchback process, only the thicker W in the contact/via holes are left. Since the process relies on the removal of all W CVD except in the contact holes, the uniformity of the W deposition and the RIE etchback process is critical for the successful formation of W contact/via plugs. When the process is not accurately controlled, such as with the preposition of a nucleation layer of Ti/TiN, the W contact/via plugs may be substantially recessed after the etchback process and thus results in poor step coverage on the device.

In the deposition of contact/via plugs by the W CVD process, another process difficulty has been observed which is caused by the very nature of the excellent coverage capability of tungsten particles. In a CVD chamber where a wafer is held on a vacuum chuck, on the bottom side of the wafer and specifically around the edges of the wafer, tungsten particles may also deposit which causes a problem known as a backside pressure fault or BSPF. When a backside pressure fault occurs, the servo pressure (which indicates the chamber pressure) exceeds a maximum allowable value such that the deposition process must be stopped. When the backside pressure fault problem is corrected and the deposition process restarted in the process chamber, the W contact/via plugs formed on the wafer surface, particularly around an edge portion of the wafer, are frequently defective and are lost after a W etchback process. The BSPF problem is believed to have been caused by the formation of uneven layers of $WSi_x$ from the prenucleation layer of Si, particularly around the edges of the wafer due to a warped wafer or poorly positioned wafer on the vacuum chuck. It is believed that, when non-uniform $WSi_x$ layers are formed in the contact/via hole prior to the filling of the hole with bulk W, a dry etchant such as $SF_3$ etches the $WSi_x$ film at a much faster rate than the W layer (on top of the device) during an etchback process. This results in a complete loss of the W contact/via plug that was formed in the contact/via hole. A typical defect of a lost W contact/via plug is shown in FIG. 1 which was taken after an etchback process has been performed. In order to eliminate the backside pressure fault problem observed in a W CVD process, the formation of uneven WSi$_x$ films and the subsequent etching of the films by a dry etchant must be avoided.

In a co-pending application (Attorney Docket No. 67,200-156), a novel method for depositing W in a contact plug without the plug loss defect is disclosed. The method utilizes a rapid thermal process to heat treat a wafer after a Si prenucleation layer is first deposited at 600° C. for at least 15 seconds. While the method is effective in forming contact plugs, it can not be used for forming via plugs which are frequently located between aluminum conductive layers since aluminum can not stand a temperature higher than 480° C.

It is therefore an object of the present invention to provide a method for forming a tungsten contact/via plug in a tungsten CVD process without the drawbacks or shortcomings of the conventional tungsten deposition methods.

It is another object of the present invention to provide a method for forming a tungsten contact/via plug in a W CVD process without the plug loss defect after a backside pressure fault has occurred in the process chamber.

It is a further object of the present invention to provide a method for forming a tungsten contact/via plug in a W CVD process without the plug loss defect by incorporating a plasma treatment step on the substrate prior to the deposition of tungsten for filling the contact/via hole.

It is another further object of the present invention to provide a method for forming a tungsten contact/via plug in a W CVD process without the plug loss defect by plasma treating the substrate at a temperature of not higher than 480° C. for at least 15 seconds by a H$_2$ plasma prior to the tungsten deposition process for filling the contact/via hole.

It is still another object of the present invention to provide a method for forming a tungsten contact/via plug in a W CVD process without the plug loss defect by plasma treating the substrate at a temperature of not higher than 480° C. and by avoiding the formation of W Si$_x$ films in the contact/via hole.

It is still another further object of the present invention to provide a method for forming a tungsten contact/via plug in a W CVD process without the plug loss defect by first depositing a silicon prenucleation layer in the contact hole and then plasma treating the substrate at a temperature of not higher than 480° C. such that substantially no WSi$_x$ is formed in the contact/via hole.

It is yet another further object of the present invention to provide a method for forming a tungsten contact/via plug in a W CVD process without the plug loss defect by first depositing a glue layer of Ti/TiN, and then depositing a silicon prenucleation layer in the contact/via hole prior to a plasma treatment process on the substrate at a temperature of not higher than 480° C. for at least 15 seconds by a H$_2$ plasma such that substantially no WSi$_x$ film is formed in the contact/via hole.

SUMMARY OF THE INVENTION

In accordance with the present invention, a method for forming a tungsten contact/via plug in a W CVD process without the plug loss defect after a backside pressure fault occurrence in the deposition chamber is provided.

In the preferred embodiment, a method for forming a W contact/via plug in a W CVD process without the plug loss defect after a backside pressure fault occurrence in the process chamber can be carried out by the steps of first providing a pre-processed semi-conducting substrate, depositing an insulating layer on top of the substrate, forming at least one contact/via hole in the insulating layer, depositing a Si prenucleation layer in the at least one contact/via hole, plasma treating the substrate at a temperature of not higher than 480° C. for making the Si prenucleation layer in the contact/via hole more uniform, and depositing W by a CVD process filling the at least one contact/via hole.

The method for forming a W plug in a W CVD process without plug loss problem may further include the step of depositing a Si prenucleation layer of less than 500 Å thick in the contact/via hole. The method may further include the step of observing a backside pressure fault in the CVD chamber and stopping the deposition process. The method may further include the step of plasma treating a substrate for a time period sufficient to improve the uniformity of the silicon prenucleation layer in the contact/via hole. The method may further include the step of plasma treating the substrate for a time period of between about 15 seconds and about 60 seconds. The method may further include the step of plasma treating the substrate for a time period of not less than 15 seconds.

The method for forming a W contact/via plug in a W CVD process without the plug loss defect may further include the step of a SiH$_4$ soak. The SiH$_4$ soak step may be carried out at a SiH$_4$ pressure of less than 20 Torr. The SiH$_4$ soak step forms an atomic layer of Si as a prenucleation layer for a subsequent W nucleation layer deposition. The Si prenucleation layer deposited may form a Si-rich W layer after a W nucleation process. The Si prenucleation layer deposited in the at least one contact/via hole substantially does not form WSi$^x$.

In an alternate embodiment, a method for forming a W contact/via plug in a W CVD process without the plug loss defect after a backside pressure fault occurrence in the process chamber can be carried out by the operating steps of providing a pre-processed silicon substrate depositing a Si prenucleation layer in the at least one contact/via hole, plasma treating the substrate at a temperature of not higher than 480° C. for a time period of at least 15 seconds such that substantially no WSi$_x$ is formed, and depositing a W layer filling the at least one contact/via hole.

The method for forming a W contact/via plug in a W CVD process without the plug loss defect may further include the step of depositing a Si prenucleation layer. The Si prenucleation layer deposited may have a thickness of not more than 500Å. The method may further include the step of plasma treating the substrate by a H$_2$ plasma for a time period of between about 15 seconds and about 60 seconds. The method may further include the step of depositing a Si prenucleation layer in a SiH$_4$ soak step. The Si prenucleation layer deposited may form a Si-rich W layer after a W nucleation layer deposition.

BRIEF DESCRIPTION OF THE DRAWINGS

These and other objects, features and advantages of the present invention will become apparent from the following detailed description and the appended drawings in which:

FIGS. 1A and 1B are enlarged, plane view and cross-sectional views of via holes for tungsten via plugs that were formed by a conventional method and lost after an etchback process.

FIG. 2 is a process flow chart for the present invention novel method for forming tungsten contact/via plugs without the plug loss defect.

FIG. 3 is a chart illustrating test data for samples with and without the present invention H$_2$ plasma treatment step.

DETAILED DESCRIPTION OF THE PREFERRED EMBODIMENT

Figure 4A:
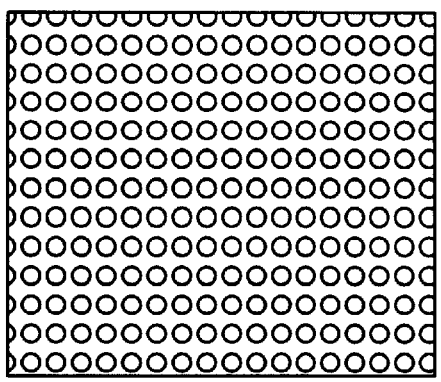
FIGS. 4A and 4B are enlarged, plane view and cross-sectional views of tungsten via plugs formed by the present invention novel method after a tungsten etchback step.

The present invention discloses a method for forming a tungsten contact/via plug in a W CVD process that is without the plug loss defect after a backside pressure fault occurrence has been observed in a CVD process chamber. The process incorporates an additional step of plasma treatment by a $H_2$ plasma with the substrate heated to a temperature of not higher than 480° C. for a time period of at least 15 seconds. It is preferred that the substrate be plasma treated by a $H_2$ plasma for a time period of between about 15 seconds and about 60 seconds at 440° C. Prior to the plasma treatment step, the contact/via holes are first coated with a Si prenucleation layer in a silane soak step. It is believed that the present invention novel method of plasma treating the substrate makes the Si prenucleation layer more uniform such that substantially no $WSi_x$ film is formed after a nucleation layer of tungsten is subsequently deposited on top of the Si prenucleation layer. After the $H_2$ plasma treatment process, a hydrogen reduction process for depositing bulk tungsten by a CVD technique is used to completely fill the contact/via hole and to form the contact/via plug. The contact/via plug formed by the present invention method does not exhibit the plug loss defect after a tungsten etchback process is conducted on the substrate.

The present invention novel method may be described by the process flow chart 10 shown in FIG. 2. A Si prenucleation layer of less than 500 Å thick is then deposited into the contact/via holes in step 12. The deposition is carried out in a $SiH_4$ soak process. In the next step 14 of the present invention novel method, a $H_2$ plasma is used to treat the silicon substrate after the $SiH_4$ soak process. In the $H_2$ plasma treatment process, the silicon substrate is heated to a temperature of not higher than 480° C., and preferably to a temperature of about 440° C. The time required for the heat treatment is not less than 15 seconds, and preferably between about 15 seconds and about 60 seconds. The plasma treatment process conducted makes the silicon prenucleation layer deposited previously in the silane soak step more uniform such that substantially no $W Si_x$ film is formed after a subsequent W nucleation layer is deposited. On top of the Si prenucleation layer is then deposited a W nucleation layer of less than 100 nm thick. This is shown in step 16.

In the next step 16 of the process, a tungsten CVD process is conducted to fill the contact/via holes and to form the contact/via plugs followed by a tungsten etch back process 30 for removing the excess tungsten layer on top of the substrate. During the silane soak process, a silane gas of $SiH_4$ is flown into the process chamber to a pressure of about 30 Torr such that an atomic layer, or a prenucleation layer of Si of less than 500 Å thick may be formed as a seed layer for the subsequent tungsten nucleation layer deposition. The present invention novel method prevents substantially the formation of any tungsten silicide, or $WSi_x$ films in the contact/via hole such that $WSi_x$ is not etched at a much faster rate by the dry etchant in the subsequent W etchback process resulting in the loss of the plug.

The desirable results achieved by the present invention novel method of $H_2$ plasma treatment a silicon substrate prior to the tungsten CVD process is shown in FIG. 3. Ten different samples are presented in FIG. 3 wherein sample 1 did not exhibit the backside pressure fault problem, however, the process was arbitrarily stopped after the "check BSPF" step. While a vacuum break has occurred in the process chamber, the substrate is not annealed and not scrubbed resulting in no tungsten plug loss. In sample 2, the backside pressure fault defect occurred in the process chamber and the silicon substrate was not plasma treated. It is seen that tungsten plug loss defect occurred in sample 2.

Samples 3–6 were treated by a $N_2$ plasma at various servo pressures for various time periods. It was found that $N_2$ plasma was not effective in preventing the plug loss defect from occurring. The samples processed by the present invention novel method are shown as samples 7, 8 and 9. In samples 8 and 9, the backside pressure fault problem has occurred in the process chamber, and the silicon substrate is treated by $H_2$ plasma for 20 and 30 seconds, respectively with substantially no plug loss defect found. Sample 7 was treated with $H_2$ plasma for only 10 seconds, plug loss defect was still found.

Figure 4B:
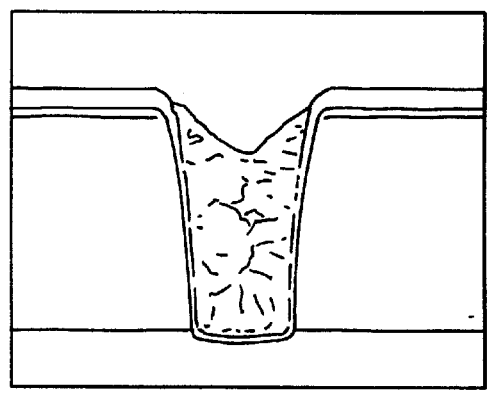

Enlarged, plane view and cross-sectional view of tungsten via plugs formed by the present invention novel method incorporating the $H_2$ plasma treatment step are shown in FIG. 4. After the tungsten etchback step, the plugs formed in the via holes are not affected at all even though a backside pressure fault was previously observed in the process chamber. The effectiveness of the present invention novel method which utilizes a $H_2$ plasma treatment step has been clearly demonstrated in the appended drawings of FIGS. 2–4.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for forming a tungsten contact/via plug in a W CVD process without plug loss defect after a backside pressure fault occurrence comprising the steps of:
   providing a substrate with at least one contact/via hole,
   depositing a Si prenucleation layer in at least one contact/via hole,
   treating said substrate by a $H_2$ plasma for at least 15 seconds, and
   depositing tungsten by a CVD process filling said at least one contact/via hole.

2. A method for forming a tungsten contact/via plug in a W CVD process without plug loss problem after a backside pressure fault occurrence according to claim 1 further comprising the step of depositing a Si prenucleation layer of less than 500 Å thick in said at least one contact/via hole.

3. A method for forming a tungsten contact/via plug in a W CVD process without plug loss problem after a backside pressure fault occurrence according to claim 2 further comprising the use of a CVD chamber and the step of observing a backside pressure fault in said CVD chamber and stopping said Si prenucleation layer deposition process.

4. A method for forming a tungsten contact/via plug in a W CVD process without plug loss problem after a backside pressure fault occurrence according to claim 1 further comprising the step of plasma treating said substrate at a temperature sufficient for improving the uniformity of said Si prenucleation layer in said at least one contact/via hole.

5. A method for forming a tungsten contact/via plug in a W CVD process without plug loss problem after a backside pressure fault occurrence according to claim 1 further comprising the step of plasma treating said substrate by a $H_2$ plasma at a temperature between about 380° C. and about 480° C.

6. A method for forming a tungsten contact/via plug in a W CVD process without plug loss problem after a backside pressure fault occurrence according to claim 1 further comprising the step of plasma treating said substrate by a $H_2$ plasma for a time period between about 15 seconds and about 60 seconds.

7. A method for forming a tungsten contact/via plug in a W CVD process without plug loss problem after a backside pressure fault occurrence according to claim 1, wherein said step of forming a Si prenucleation layer comprises a $SiH_4$ soak step.

8. A method for forming a tungsten contact/via plug in a W CVD process without plug loss problem after a backside pressure fault occurrence according to claim 7, wherein said $SiH_4$ soak step is carried out at a $SiH_4$ pressure of less than 20 Torr.

9. A method for forming a tungsten contact/via plug in a W CVD process without plug loss problem after a backside pressure fault occurrence according to claim 7, wherein said $SiH_4$ soak step forms an atomic layer of Si as a prenucleation layer for a subsequent W nucleation layer deposition.

10. A method for forming a tungsten contact/via plug in a W CVD process without plug loss problem after a backside pressure fault occurrence according to claim 1, wherein said Si prenucleation layer deposited forms a Si-rich W layer after a W nucleation layer deposition process.

11. A method for forming a tungsten contact/via plug in a W CVD process without plug loss problem after a backside pressure fault occurrence according to claim 1, wherein said Si prenucleation layer deposited in said at least one contact/via hole substantially does not form $WSi_x$.

12. A method for forming a tungsten contact/via plug in a W CVD process without plug loss defect after a backside pressure fault occurrence comprising the steps of:

providing a substrate with at least one contact/via hole, depositing a Si prenucleation layer in said at least one contact/via hole, treating said substrate at a temperature of not higher than 480° C. for a time period of at least 15 seconds by a $H_2$ plasma such that substantially no $WSi_x$ is formed after a subsequent W nucleation layer deposition, and depositing a W layer filing said at least one contact/via hole.

13. A method for forming a tungsten contact/via plug in a W CVD process without plug loss defect according to claim 12 further comprising the step of depositing a glue layer in said at least one contact/via hole prior to the deposition of said Si prenucleation layer.

14. A method for forming a tungsten contact/via plug in a W CVD process without plug loss defect according to claim 12, wherein said Si prenucleation layer deposited has a thickness of not more than 500 Å.

15. A method for forming a tungsten contact/via plug in a W CVD process without plug loss defect according to claim 12 further comprising the step of plasma treating said substrate for a time period between about 15 seconds and about 60 seconds.

16. A method for forming a tungsten contact/via plug in a W CVD process without plug loss defect according to claim 12 further comprising the step of depositing said Si prenucleation layer in a $SiH_4$ soak process.

17. A method for forming a tungsten contact/via plug in a W CVD process without plug loss defect according to claim 12 further comprising the step of plasma treating said substrate for at least 15 seconds at 440° C.

* * * * *